United States Patent

Cheung et al.

[11] Patent Number: 5,965,934
[45] Date of Patent: Oct. 12, 1999

[54] PROCESSING TECHNIQUES FOR ACHIEVING PRODUCTION-WORTHY, LOW DIELECTRIC, LOW INTERCONNECT RESISTANCE AND HIGH PERFORMANCE ICS

[75] Inventors: Robin W. Cheung, Cupertino; Mark S. Chang, Los Altos, both of Calif.

[73] Assignee: Advanced Micro Devices, Inc., Sunnyvale, Calif.

[21] Appl. No.: 08/681,141

[22] Filed: Jul. 22, 1996

Related U.S. Application Data

[63] Continuation of application No. 08/360,856, Dec. 21, 1994, Pat. No. 5,550,405.

[51] Int. Cl.$^6$ ............ H01L 23/48; H01L 23/52; H01L 29/40
[52] U.S. Cl. ............ 257/642; 257/751; 257/752; 257/759
[58] Field of Search ............ 257/759, 762, 257/763, 764, 765, 768, 767, 769, 770, 751, 752, 642, 643, 758

[56] References Cited

U.S. PATENT DOCUMENTS

| | | | |
|---|---|---|---|
| 4,410,622 | 10/1983 | Dalal et al. | 430/312 |
| 4,970,574 | 11/1990 | Tsunemari | 357/71 |
| 4,974,055 | 11/1990 | Haskell | 357/71 |
| 4,977,108 | 12/1990 | Haskell | 437/229 |
| 5,028,555 | 7/1991 | Haskell | 437/57 |
| 5,034,801 | 7/1991 | Fischer | 357/72 |
| 5,055,427 | 10/1991 | Haskell | 437/203 |
| 5,057,902 | 10/1991 | Haskell | 357/71 |
| 5,081,516 | 1/1992 | Haskell | 357/42 |
| 5,371,407 | 12/1994 | Goldman | 257/675 |
| 5,409,777 | 4/1995 | Kennedy et al. | 428/411.1 |
| 5,550,405 | 8/1996 | Cheung et al. | 257/642 |

FOREIGN PATENT DOCUMENTS

| | | | |
|---|---|---|---|
| 0 150 403 A1 | 8/1985 | European Pat. Off. | H01L 21/90 |
| 0 561 132 A1 | 9/1993 | European Pat. Off. | H01L 23/485 |

OTHER PUBLICATIONS (no author) "Multilevel Interconnection Structure", IBM TEchnical Disclosure Bulletin, vol. 34, No. 9, Feb. 1992, pp. 220.

D–Y. Shih et al, "Cu passivation: A method of inhibiting copper–polyamic acid interactions", Appl. Phys. Lett. 59(12), Sep. 16, 1991, pp. 1424–1426.

Thomas C. Hodge et al, "Rapid Thermal Curing of Polymer Interlayer Dielectrics", The International Journal of Microcircuits & Electronic Packaging, vol. 17, No. 1, First Quarter 1994 (ISSN 1063–1674), pp. 10–19.

*Primary Examiner*—William Mintel
*Attorney, Agent, or Firm*—Sawyer & Associates

[57] ABSTRACT

The interconnects in a semiconductor device contacting metal lines comprise a low resistance metal, such as copper, gold, silver, or platinum, and are separated by a material having a low dielectric constant, such as benzocyclobutene or a derivative thereof A tri-layer resist structure is used, together with a lift-off process, to form the interconnects. The low dielectric constant material provides a diffusion barrier to the diffusion of the low resistance metal. The tri-layer resist comprises a first layer of a dissolvable polymer, a second layer of a hard mask material, and a third layer of a resist material. The resulting structure provides an integrated circuit with increased speed and ease of fabrication.

9 Claims, 3 Drawing Sheets and

PROCESSING TECHNIQUES FOR ACHIEVING PRODUCTION-WORTHY, LOW DIELECTRIC, LOW INTERCONNECT RESISTANCE AND HIGH PERFORMANCE ICS

This is a continuation of application Ser. No. 08/360,856 filed on Dec. 21, 1994 now U.S. Pat. No. 5,550,405.

TECHNICAL FIELD

The present invention relates generally to semiconductor devices in integrated circuits (ICs), and, more particularly, to semiconductor devices having a reduced RC (resistance times capacitance) time constant and hence faster speed.

BACKGROUND ART

Concepts of low dielectric constants integrated with low interconnect resistance metal structures have been proposed by many technologists. Those ideas include "pillar plugs", "anti-contacts/vias", spin-on-low-dielectric-constant insulators (either organic and/or inorganic), spin-on layered low dielectric constant materials and technology, damascene of metal interconnects and dual damascene of metal interconnects. By "damascene" is meant a process in which trenches or contact/via openings are formed and then filled with metal using CVD (chemical vapor deposition) or PVD (physical vapor deposition) or other techniques, followed by a polish to remove any overfilled areas. The term is based on a process developed by goldsmiths in ancient Damascus, comprising crafting a pattern or design on a hard surface and then hammering fine gold wires onto the designed pattern.

Many ideas have been proposed for combinations of low dielectric constant and low interconnect resistance metal structures, but none have been introduced into commercial practice at this time. The only demonstration of these new advanced concepts is work done by IBM on BPDA-PDA integration with copper interconnects. "BPDA-PDA" refers to a polyimide available from E.I. du Pont de Nemours, under the trade designation PI-2610. The BPDA-PDA is intended to replace silicon dioxide. However, since copper is a source of contamination, then special care has to be taken to prevent copper from diffusing into other parts of the IC structure and causing failures. This is done by using a $Si_3N_4$ layer to separate the copper layer and the BPDA-PDA layer. However, $Si_3N_4$ has a dielectric constant of about 8, which increases capacitance over that of structures employing silicon dioxide. Further, a barrier metal, comprising approximately 1000 Å of refractory metal cladding is added, which increases the interconnect resistance. While this technology employs very advanced processing techniques such as dual damascene and chemical vapor deposited (CVD) copper and provides reliable interconnects, nevertheless, the final result is a very minor improvement over the existing system. The composite dielectric constant of BPDA-PDA is about 3.8 and the copper/refractory metal has a composite resistance of about 2.6 $\mu\Omega$-cm, as compared to the conventional $SiO_2$ dielectric and Al interconnect (4.0 dielectric constant and 2.8–3.2 m$\Omega$-cm resistance, respectively). The slight improvement in overall capacitance and resistance is achieved at a high process cost, and thus is not cost-justified.

Thus, there remains a need for providing a comparatively simple process that results in increased device speed.

DISCLOSURE OF INVENTION

In accordance with the invention, the interconnects contacting metal lines comprise a low resistance metal and are separated by a material having a low dielectric constant. As used herein, "low resistance metal" refers to a metal having a sheet resistance less than that of any of the aluminum alloys presently employed as interconnects. For example, the sheet resistance of pure aluminum is about 2.8 $\mu\Omega$-cm, while that of Al-1%Cu is about 3.3 $\mu\Omega$-cm. By "low dielectric constant" is meant that the dielectric constant is less than that of $SiO_2$, or less than about 4.0. In the process of the present invention, a tri-layer resist structure is used, together with a lift-off process, to form the interconnects.

The semiconductor device is formed on a wafer and comprises source and drain regions contacted by source and drain contacts, respectively, with each source and drain region separated by a gate region contacted by a gate electrode. A first level patterned interconnect contacts the source and drain contacts and the gate electrode in a desired pattern. A second level patterned interconnect contacts the first level patterned interconnect by a plurality of metal lines, which are separated by a first dielectric material. The second level patterned interconnect comprises the low resistance metal and the interconnects are separated by the low dielectric constant material, which is planarized. The low dielectric constant material is inert to diffusion of the low resistance metal.

In the process of the invention, the second level patterned interconnect is fabricated by forming and patterning a tri-layer resist on the first interlevel dielectric layer to expose top portions of the metal lines. The tri-layer resist comprises a first layer of a dissolvable polymer, a second layer of a hard mask material, and a third layer of a resist material. Examples of hard mask materials include $SiO_2$, $Si_3N_4$, silicon oxy-nitride, sputtered silicon, amorphous silicon (e.g., by the CVD method), and amorphous carbon (e.g., by the PVD or CVD methods). Next, a metal layer having a resistance no greater than 2.8 $\mu\Omega$-cm is blanket-deposited on the wafer. Examples include Cu (1.8 $\mu\Omega$-cm), Au (2.5 $\mu\Omega$-cm), and Ag (1.7 $\mu\Omega$-cm). The first layer of the tri-layer resist, comprising the dissolvable polymer, is removed to thereby lift off metal thereover. Finally, a coating of benzocyclobutene or a derivative thereof is spun on to cover the metal layer.

The invention disclosed here solves all the practical issues disclosed concepts. All techniques used are proven production technologies. A slight process enhancement is incorporated to ensure easy implementation in volume production IC fabrication area.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. 1–6 are cross-sectional views at various stages in the processing of wafers in accordance with the present invention, in which:

FIG. 1 depicts the wafer at a stage with contact plugs and the first interlayer dielectric formed on a substrate with active devices formed thereon;

FIG. 2 depicts the wafer after tri-level resist patterning;

FIG. 3 depicts the wafer after proper surface overetch;

FIG. 4 depicts the wafer after metal evaporation;

FIG. 5 depicts the wafer after metal lift-off; and

FIG. 6 depicts the wafer after dielectric spin-coat with benzocyclobutene (BCB).

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

It is assumed that the incoming wafers are properly fabricated and the latest production techniques are used. It is worthwhile to note that this invention is not limited to the following outlined process, but is so chosen so that the key aspects can be easily visualized.

Figure 1:
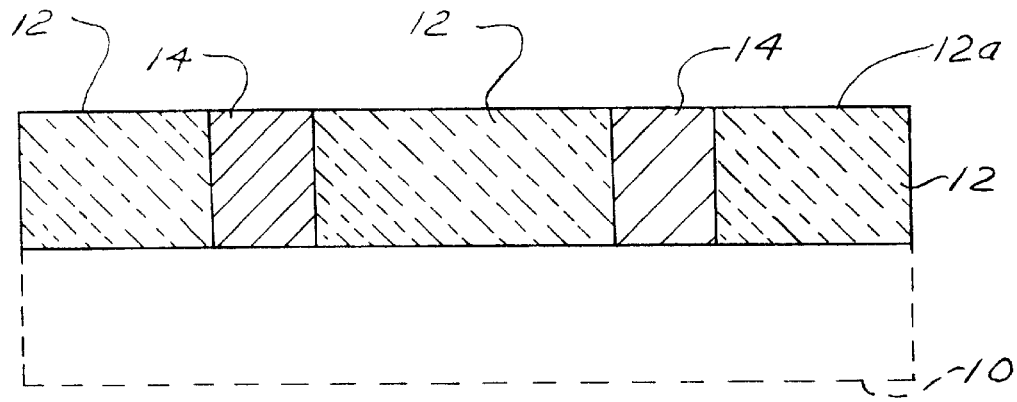

FIG. 1 depicts the incoming wafers. Active devices, i.e., transistors, are formed by conventional techniques on the substrate; the substrate and active devices formed thereon are collectively denoted 10. Source and drain contacts make contact to corresponding source and drain regions, while gate electrodes make contact to a thin gate oxide for forming a gate region between the source and drain region. The source and drain contacts and gate electrodes are separated by an oxide and are self-aligned with each other and are planarized with the oxide. Details of this aspect of the process are disclosed in a series of patents issued to Jacob D. Haskell and assigned to the same assignee as the present application (U.S. Pat. Nos. 4,974,055; 4,977,108; 5,028,555; 5,055,427; 5,057,902; and 5,081,516). As is also described therein, a first interlevel dielectric layer 12 is formed and is then planarized by chemical-mechanical polishing (CMP) techniques. Contacts are defined and conventional tungsten plugs 14 are formed by blanket deposition and CMP polishing. Now the wafers are ready for the invention disclosed herein.

Metalization is deposited by modified conventional lift-off techniques, as now described below.

First, a tri-layer resist 16 is coated on the planarized surface 12a. The first layer 16a is a thick layer of polymethyl methacrylate (PMMA) or other polymer with proper optimization to achieve planarization. The thickness is about 0.5 to 3 $\mu$m. The actual thickness depends on design choice of metal interconnect thickness and width requirements. A rule of thumb for the ratio of the PMMA thickness to interconnect thickness is about 2:1 to ensure good electrical yield, that is, no defects. In other words, the metal deposited should be no more than about 50% of the PMMA thickness.

A thin layer 16b of $SiO_2$ or Si is next deposited by any of plasma enhanced chemical vapor deposition (PECVD) or physical vapor deposition (PVD) or spin coating techniques. Other materials that may be employed for the thin layer 16b include $Si_3N_4$, silicon oxy-nitride, sputtered silicon, amorphous silicon (e.g., by the CVD method), and amorphous carbon (e.g., by the PVD or CVD methods). The thickness is about 200 to 500 Å; this layer 16b serves as the hard mask for pattern transfer. Then, a thin layer 16c of conventional photoresist is coated on the hard mask layer 16b, typically to a thickness of about 5,000 to 15,000 Å. A The thickness of the thin layer 16c is a function of the wavelength used in the exposure system, e.g., G-line, I-line, or DUV (deep ultraviolet). The technologist may either choose the maximum or minimum on the swing curve (the swing curve is a function of thickness). Usually, technologists choose the minimum resist thickness that corresponds to either the maximum or minimum of the swing curve.

Figure 2:
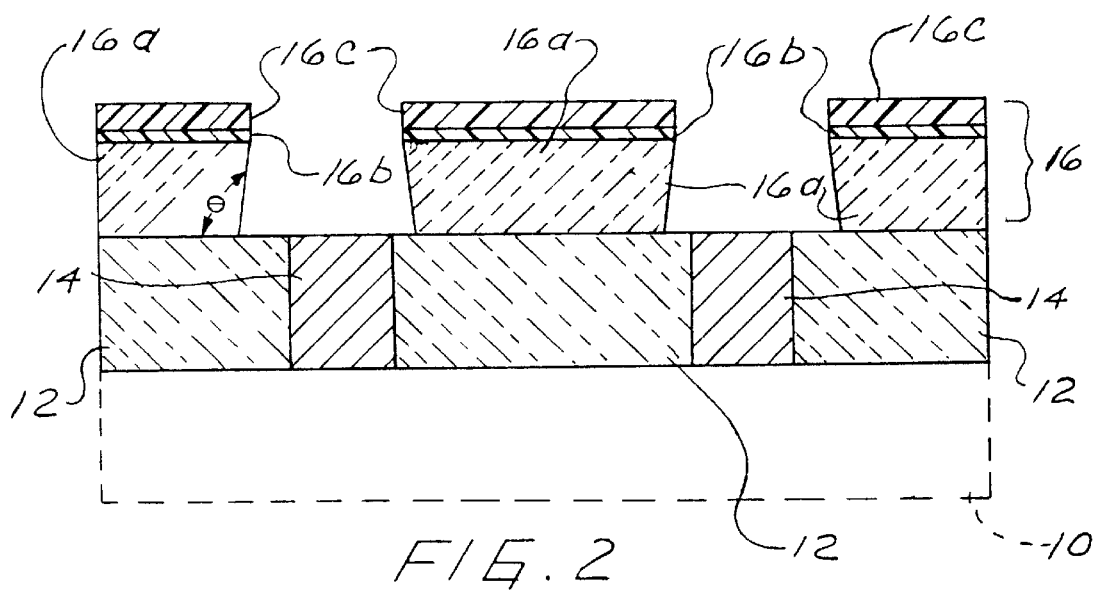

Conventional lithography techniques are used to pattern the conventional photoresist layer 16c. The image is transferred to the hard mask 16b by dry etch techniques, employing conventional plasma chemistry. Dry etch is again used to transfer the image from the hard mask 16b to the PMMA or polymer layer 16a. Appropriate plasma chemistry is used to create a slight re-entrant angle $\theta$. As an example, the chemistry could employ conventional $CF_4$ plasma or simple $O_2$ plasma. By "slight re-entrant angle" is meant an angle of greater than 90°, preferably, greater than 100°. The resulting structure is shown in FIG. 2.

Figure 3:
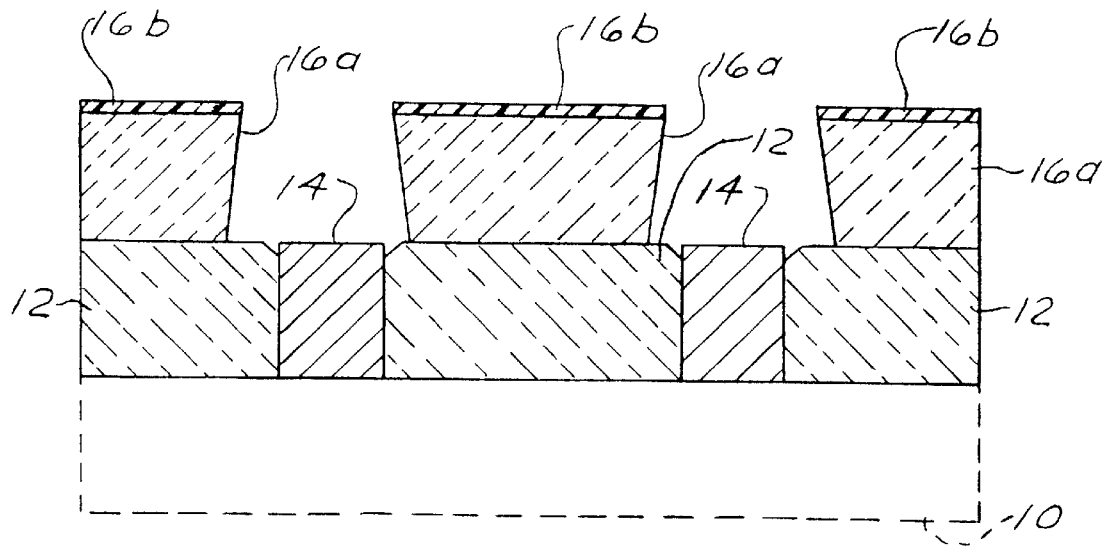

Appropriate plasma chemistry is next used to etch the wafer surface 12a to ensure the plugs or underneath metal layers 14 are exposed at the desired location. The appropriate plasma chemistry could employ either $CF_4$, $CHF_3$, or other fluorine chemistry with or without oxygen chemistry. The processing pressure would have to be optimized to give the correct profile; however, this is not considered to constitute undue experimentation. The wafer surface etching advantageously removes the top photoresist layer 16c, depending on the choice of chemistry, although the removal may be performed in a separate step. The use of the hard mask 16b protects the integrity of the PMMA during etching. The resulting structure is shown in FIG. 3.

Following removal of the top photoresist layer 16c, a high temperature bake is performed to that ensure no out-gassing of the PMMA layer 16a interferes with the metal deposition step, described below. The high temperature bake is carried out after layer 16c is removed and prior to the metal deposition. Specifically, the high temperature bake must be performed at a lower temperature than the glass transition temperature ($T_g$) of the PMMA layer 16a and yet higher than the metal deposition temperature for good yield. As an example, in the case of PMMA as the layer 16a, the wafer is baked at about 350° C. Use of another polymer may require a different baking temperature, within the constraints given above.

A metal layer 18, specifically, a low resistance metal such as copper, gold, silver, platinum or other noble metal, is deposited everywhere by resistive heat evaporation or low temperature deposition techniques. Electron-beam evaporation technique is not recommended because of radiation damage concerns. PVD techniques are acceptable if the PMMA or polymer 16a has a relatively high glass transition temperature, higher than the bake temperature.

Figure 4:
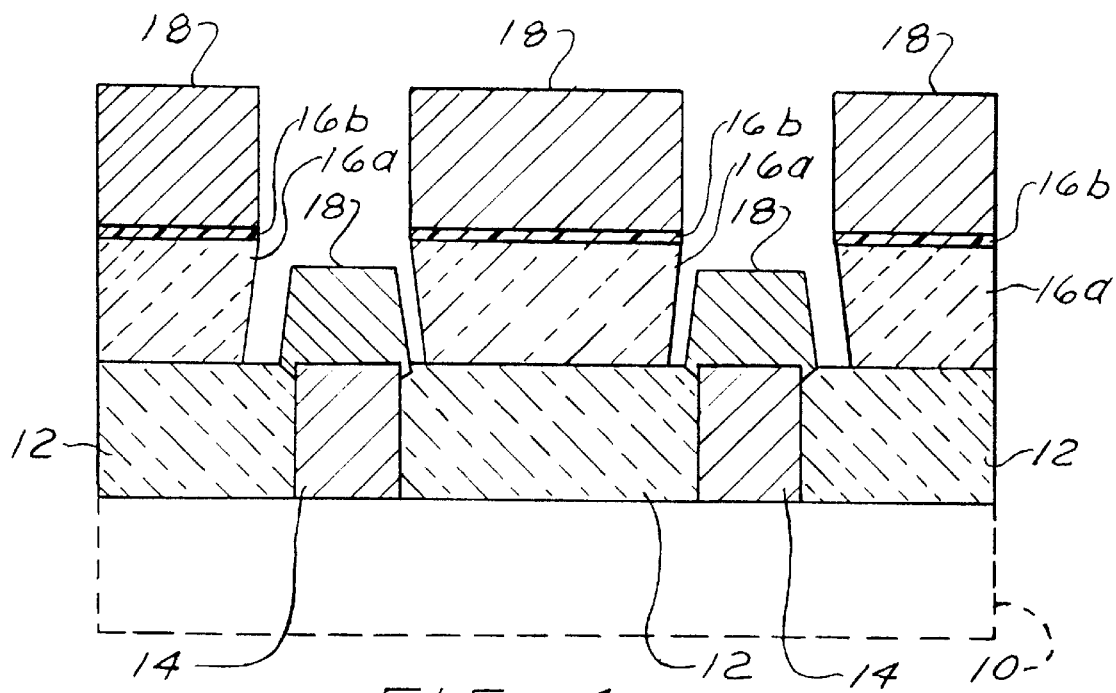

The desired thickness of the metal layer 18 is deposited, within the range of about 2,000 to 10,000 Å. Desirably, a thin layer of tantalum, palladium, or titanium or other refractory metal of no more than 200 to 300 Å is first deposited before depositing the bulk metal, employing the same techniques. The refractory metal helps to reduce the metal-to-metal contact resistance. The preferred refractory metal is palladium. The resulting structure is depicted in FIG. 4.

Figure 5:
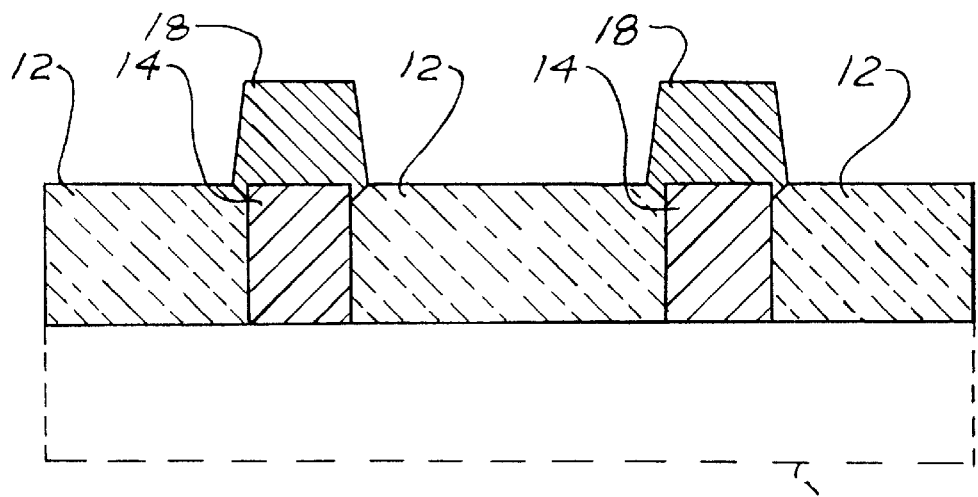

The finished wafer is immersed into a tank of appropriate solvent that will react with the PMMA or polymer 16a. The PMMA or polymer 16a swells, dissolves, and lifts off the metal 18 on the surface of the hard mask 16b, leaving only those portions of the metal 18 contacting the tungsten plugs 14. The resulting structure is shown in FIG. 5.

Any residual PMMA or polymer 16a is cleaned by another solvent or by appropriate plasma chemistry if deemed necessary to control defect density. Examples of suitable solvents include xylene and methyl iso-butyl ketone (MIBK). It is recommended that this process be carried out in an ultrasonic bath with agitation to enhance the lift-off of undesirable metalization.

Figure 6:
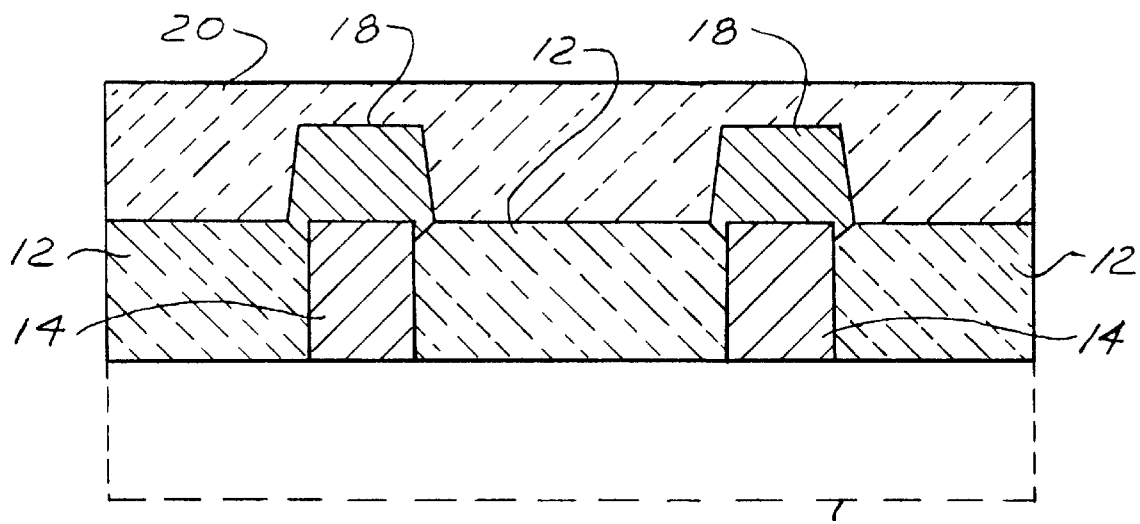

A benzocyclobutene (BCB) layer 20 or a variation of BCB is spin-coated and cured on the wafer as shown in FIG. 6 which depicts the multilayer interconnect structure of the present invention. "BCB" refers to a class of organic materials and derivatives, all manufactured by Dow Chemical (Midland, Mich.). An example of a BCB derivative is divinyl siloxane bisbenzocyclobutene (DVS-BCB).

The appropriate thickness of the BCB layer 20 depends on design to give the appropriate dielectric strength, and is within the range of about 4,000 to 10,000 Å. BCB is chosen because of its inert properties to metal diffusion. Copper and gold will not diffuse into BCB; therefore, BCB can serve as a good barrier. It is estimated that the same property will hold for other noble metals and low resistance metals. Further, BCB has a reported dielectric constant of about 2.4 to 2.7. This provides the desired dielectric constant, which is lower than that of silicon dioxide. The spin-coating process results in gap filling and planarization of the BCB layer 20.

Other suitable low dielectric materials may also be employed in the practice of the present invention. These include polyimides, polyimide siloxanes, fluoropolyimides, fluoropolymers, fully cyclized heterocyclic polymers, and polysiloxanes, which have a dielectric constant in the range of about 2.2 to 3.4.

The foregoing steps are repeated as many times as necessary to build the required multi-layer metal interconnect structures. The same sequence can be used for either plugs or interconnects.

The benefits of the process of the invention are:

1. Industry-standard metal lift-off techniques, modified, are used for metalization patterning. A difficult metal etching requirement is elated.

2. Spin-coated BCB is used to fill spaces. This achieves global and local planarization at the same time.

3. The process sequence is identical for both plugs and interconnects and provides for ease for manufacturing.

4. The process is achievable now with presently-available manufacturing techniques.

5. Noble metal structures with organic dielectric may be built without resort to polishing metal, which is very challenging at best.

6. There is no need for CVD metalization technology (if it is available, the disclosed technology is compatible as long as the temperature of the CVD metal is not too high, i.e., <350° C.).

7. The process of the invention can support any metal system without expensive hardware retooling.

8. The process of the invention can support copper deposition with built-in barrier metal processing in the same process chamber. This lowers the cost of copper integration into existing technology.

9. The process of the invention can support gold deposition. Gold is believed to be the ideal metal system for low dielectric strength ($\epsilon$) and low resistance ($\rho$) applications. With gold, there are no corrosion issues and no stress-induced voiding issues. Low $\epsilon$ and low $\rho$ will enhance speed-power performance for any IC, especially microprocessors. The power consumption is proportional to operating frequency of the IC and the square of the capacitance C. R is the resistance of the line and the RC time constant will determine the switch speed of the circuit from one state to another state, i.e., a one or a zero. Further, it is expected that superior electromigration characteristics are realized with gold, as compared to the presently-used Al alloy.

INDUSTRIAL APPLICABILITY

The multilayer interconnect structure of the present invention is expected to find use in the fabrication of semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A semiconductor device formed on a wafer comprising source and drain regions contacted by source and drain contacts, respectively, and each source and drain region separated by a gate region contacted by a gate electrode, with a first level patterned interconnect contacting said source and drain contacts and said gate electrode in a desired pattern and with a second level patterned interconnect contacting said first level patterned interconnect by a plurality of metal lines, said metal lines separated by a first dielectric material, said second level patterned interconnect comprising a low resistance metal wherein said low resistance metal is selected from the group consisting of copper, gold, silver, and platinum and separated by a planarized dielectric material inert to diffusion of said low resistance metal.

2. The semiconductor device of claim 1 wherein said low resistance metal has a sheet resistance of less than about 2.8 $\mu\Omega$-cm.

3. The semiconductor device of claim 2 wherein said low resistance metal has a thickness within the range of about 2,000 to 10,000 Å.

4. The semiconductor device of claim 3 further including a thin layer of a refractory metal underneath said low resistance metal, said thin layer having a thickness within the range of about 200 to 300 Å.

5. The semiconductor device of claim 1 wherein said planarized dielectric material consists essentially of benzocyclobutene or a derivative thereof.

6. The semiconductor device of claim 5 wherein said planarized dielectric material has a thickness within the range of about 4,000 to 10,000 Å.

7. The semiconductor device of claim 4 wherein said thin layer of said refractory metal comprises a metal selected from the group consisting of tantalum, palladium, and titanium.

8. The semiconductor device of claim 7 wherein said thin layer of said refractory metal consists essentially of palladium.

9. The semiconductor device of claim 1 wherein said plurality of metal lines comprises tungsten.

* * * * *